United States Patent [19]

Hutson

[11] 4,216,488

[45] Aug. 5, 1980

[54] LATERAL SEMICONDUCTOR DIAC

[76] Inventor: Jearld L. Hutson, P.O. Box 34235, Dallas, Tex. 75234

[21] Appl. No.: 929,401

[22] Filed: Jul. 31, 1978

Related U.S. Application Data

[63] Continuation of Ser. No. 755,441, Dec. 29, 1976, abandoned.

[51] Int. Cl.² .......................................... H01L 29/747
[52] U.S. Cl. ........................................ 357/39; 357/13; 357/35; 357/37; 357/55; 357/71
[58] Field of Search .................. 357/35, 37, 13, 38, 357/39, 71, 55

[56] References Cited

U.S. PATENT DOCUMENTS

| | | | |
|---|---|---|---|
| 3,111,590 | 11/1963 | Noyce | 357/13 |
| 3,317,746 | 5/1967 | Hutson | 357/39 |
| 3,465,216 | 9/1969 | Teszner | 357/38 |

FOREIGN PATENT DOCUMENTS

| | | | |
|---|---|---|---|
| 109567 | 5/1968 | Denmark | 357/39 |
| 2261819 | 12/1972 | Fed. Rep. of Germany | 357/39 |
| 1288564 | 9/1972 | United Kingdom | 357/71 |

*Primary Examiner*—Joseph E. Clawson, Jr.
*Attorney, Agent, or Firm*—Richards, Harris & Medlock

[57] ABSTRACT

The specification discloses a lateral diac including a semiconductor body having three alternating layers of first and second opposite conductivity types of semiconductor material. An isolating member such as a groove is disposed through one of the exterior semiconductor layers in order to geometrically and electrically isolate the layer into two regions. Electrodes are attached to each of the isolated regions and are disposed in the same plane for connection to leads on a common surface. The lateral diac thus formed is normally in a nonconductive high impedance condition, but is operable in response to a predetermined breakover voltage applied across the electrodes to operate in an avalanche mode to break back to a negative resistance characteristic. The lateral construction of the diac enables the diac to be easily mounted for thick film use.

1 Claim, 8 Drawing Figures

LATERAL SEMICONDUCTOR DIAC

This is a continuation of application Ser. No. 755,441 filed Dec. 29, 1976 now abandoned.

FIELD OF THE INVENTOR

This invention relates to semiconductor devices, and more particularly relates to a diac having improved operational characteristics.

THE PRIOR ART

Diacs or symmetrical trigger diodes have been heretofore known. Diacs exhibit a high-impedance, low-leakage current characteristic until an applied voltage reaches the breakover voltage $V_{BO}$. Above this voltage, the diac exhibits a negative resistance, such that the voltage decreases as the current increases. Such diacs are commonly used in light dimmer circuits and the like in order to generate current pulses which trigger a triac into conduction. When used with the capacitor, the voltage on the diac is increased until the voltage reaches $V_{BO}$, at which point the diac voltage breaks back and a pulse of current flows as the capacitor discharges.

Normally, a diac comprises a three layer, two terminal bidirectional switch having electrodes on opposite sides which necessitate an interconnection scheme with connectors to both the top and bottom of the diac. This often requires a complicated and bulky mounting technique when the diac is used in combination with a triac. Moreover, prior diacs have not been completely satisfactory with respect to their operating characteristics and in particular have tended to be limited in higher current range operation.

SUMMARY OF THE INVENTION

In accordance with the present invention, the problems and inadequacies of previously developed semiconductor diacs have been substantially eliminated or reduced by the present invention, wherein a semiconductor diac is provided with contacts on one side to enable mounting thereof on a single planar surface. Moreover, the present invention provides a diac with improved current characteristics.

In accordance with one aspect of the invention, a lateral diac includes a semiconductor body having a pair of adjacent layers of first and second opposite conductivity types of semiconductor material. A pair of regions of the first conductivity type are formed on the exterior surface of the layer of the second conductivity type. The pair of regions are spaced apart and isolated electrically and geometrically from one another. Electrodes are attached to each of the regions and are disposed in the same plane for connection to leads on a common surface. The diac is normally in a nonconductive high impedance condition and is operable in response to a predetermined breakover voltage applied across the electrodes to operate in an avalanche mode to break back to a negative resistance characteristic.

In accordance with another aspect of the invention, a semiconductor diac is provided which includes a semiconductor body having five layers of alternating opposite semiconductor conductivity types. The central interior layer has a first conductivity type and includes two adjacent layers of the second conductivity type on opposite sides thereof. A region of the second conductivity type extends through one edge of the central interior layer and integrally connects the two adjacent layers of the second conductivity type. Electrodes contact opposing exterior surfaces of exterior layers of the first conductivity type. The diac is responsive to a predetermined breakover voltage applied across the electrodes to break back to a negative resistance characteristic.

DESCRIPTION OF THE DRAWINGS

For a more complete understanding of the present invention and for further objects and advantages thereof, reference is now made to the following description, taken in conjunction with the accompanying Drawings, in which.

DESCRIPTION OF THE PREFERRED EMBODIMENT

Figure 1:
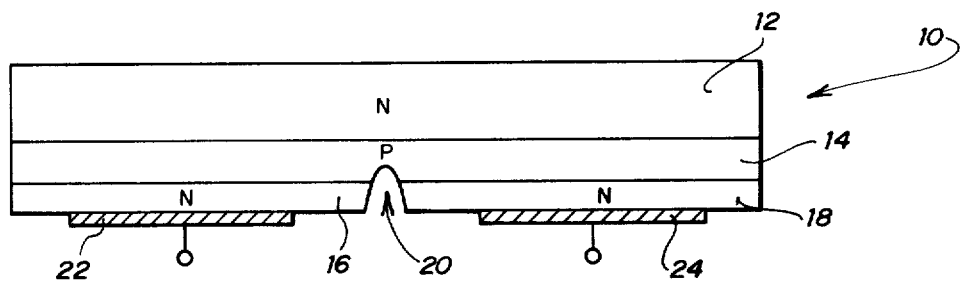
FIG. 1 is a somewhat diagrammatic cross-sectional view of a lateral diac in accordance with the present invention.

Referring to FIG. 1, the present diac is indicated generally by the numeral 10 and may be seen to comprise a semiconductor body having a layer of N-type semiconductor material 12 disposed adjacent a layer 14 of P-type material. Two regions 16 and 18 of N-type material are electrically and geometrically isolated by a groove 20 which extends into the P-type layer 14. A metal electrode 22 contacts N-type region 16, while a metal electrode 24 contacts the region 18.

The groove 20 should not have a width greater than the thickness of the semiconductor body 10. The thickness of the semiconductor body 10 may be, for example, 10 mils or greater, with the width of the groove 20 generally being 5 mils or less. The layer 14 will generally be provided with a thickness of less than 1 mil and will have a high resistivity. The surface impurity concentrations of the various layers and regions will, of course, vary according to desired operation of the device. The device is formed in accordance with any one of a number of conventional techniques, such as by diffusing gallium, indium or boron into an N-type pellet of silicon to form layers 12 and 14. The pellet may then be masked by suitable masking techniques and exposed to phosphorous diffusion to form N-type regions 16 and 18. Of course, identical structure but with opposite conductivities may be formed by other well known techniques.

Figure 2:
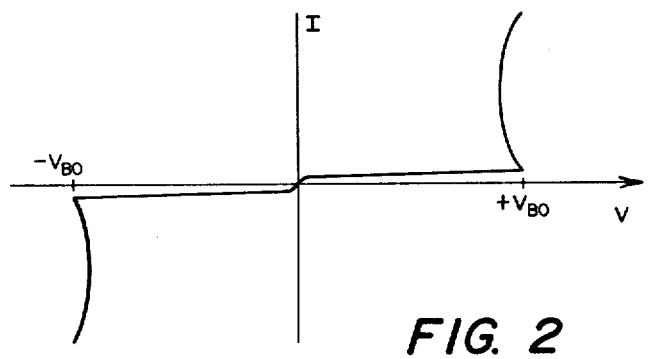
FIG. 2 is a graph of the I-V characteristics of the present diac.

FIG. 2 illustrates the voltage-current characteristics of the present device. Normally, the device is in a nonconductive high impedance condition. When a breakover voltage $V_{BO}$ is applied across the electrodes 22 and 24, the present device enters a negative-resistance region. Because of its bidirectional properties, the present diac is useful in triac controlled circuits in which variable power is to be supplied to a load. The present diac exhibits higher voltage level capabilities than previously developed diacs. In addition, the present invention exhibits an improved negative resistance snapback voltage characteristic.

Figure 3:
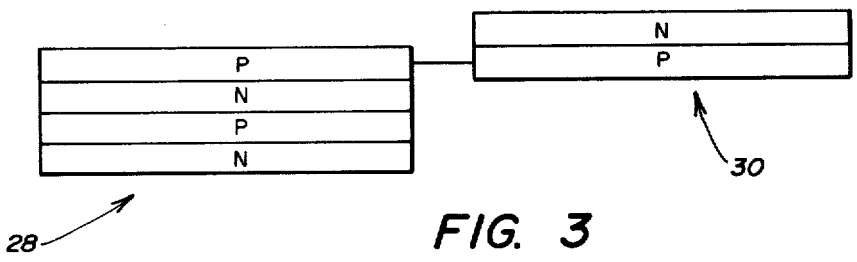
FIG. 3 is a diagrammatic illustration of an operating mode of the present diac.

FIG. 3 illustrates a diagrammatic illustration of the operation of the present device. When voltage is initially applied across the electrodes 22 and 24, the region 18 depletes with respect to layer 14 to form a depletion region. No current flows across this junction until the depletion region reaches an avalanche level. At avalanche, appreciable current begins to flow across the depletion region and appears as gate drive to a N-P-N-P device until the device completely turns on.

FIG. 3 illustrates the operation of the device as a four layer N-P-N-P device 28 which corresponds to region 16, layer 14, layer 12 and layer 14. The layers 14 and 18 comprise a zener N-P diode 30. The present device thus switches from a transistor-like operation to a five layer regenerative device equivalent to the four layer body 28 in combination with the zener diode 30 as illustrated in FIG. 3, upon final conduction. The three layers N-P-N comprising region 16 and layers 14 and 12 operate to give the device its initial snapback when the device turns on. The five layers comprising region 16, layer 14, layer 12, layer 14 and region 18 then become switched in order to provide better conduction in the high current ranges.

Figure 4:
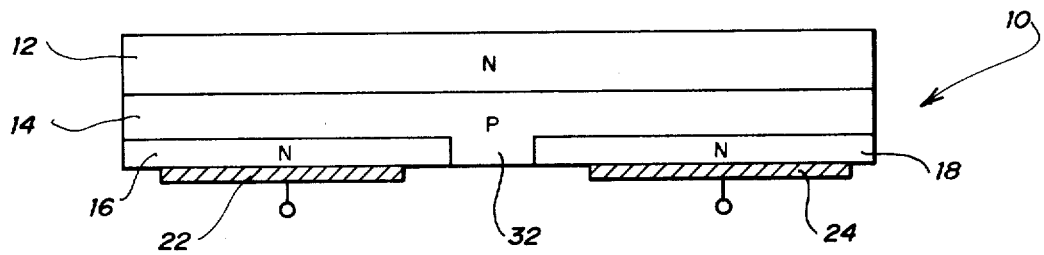
FIG. 4 is an illustration of a second embodiment of the lateral diac according to the invention.
Figure 5:
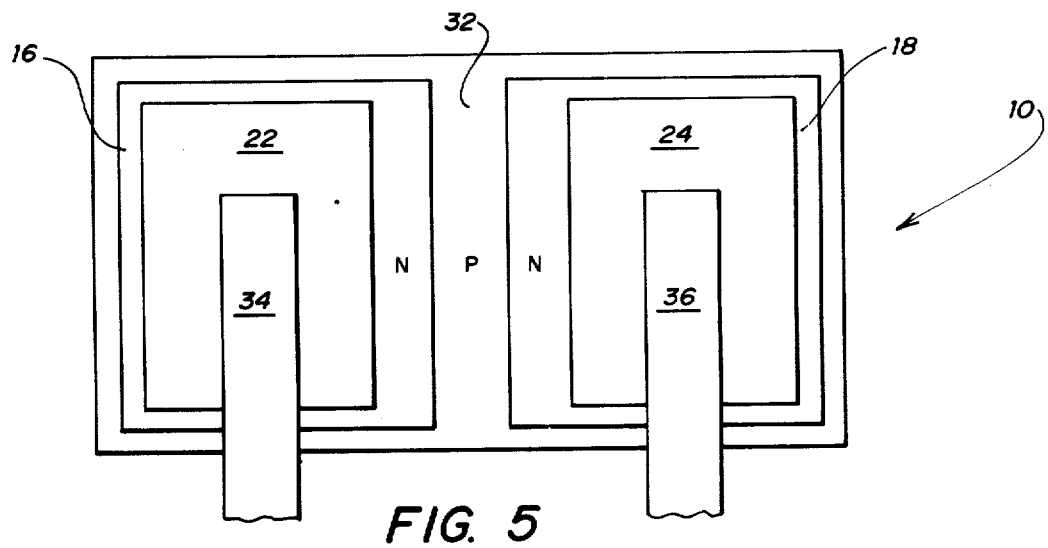
FIG. 5 is a view of one side of the diac shown in FIG. 4.

FIGS. 4 and 5 illustrate another embodiment of the device, wherein like numerals will be utilized for like and corresponding parts. In this embodiment, the construction of the semiconductor body 10 is identical to that previously shown, with the exception that in place of the groove 20, an extension 32 of P-type material is brought to the exterior surface. The extension 32 thus serves to electrically and geometrically isolate the regions 16 and 18 from one another in order to provide the desired operation.

In this embodiment, the thickness of the semiconductor body 10 may be approximately 10 mils. The combined thickness of region 18 and layer 14 may comprise from 1 to 2 mils. The thickness of the regions 16 and 18 may comprise from 0.2 to 0.7 mils.

FIG. 5 illustrates a side view of the embodiment shown in FIG. 4, and illustrates how metal leads 34 and 36 may be interconnected to the metallic electrodes 22 and 24. Inasmuch as leads 34 and 36 are disposed on the same side of the diac and on the same plane, the present diac may be advantageously mounted on the known "face down" configuration and therefore may be easily attached on a single mounting ceramic member with a triac.

Figure 6:
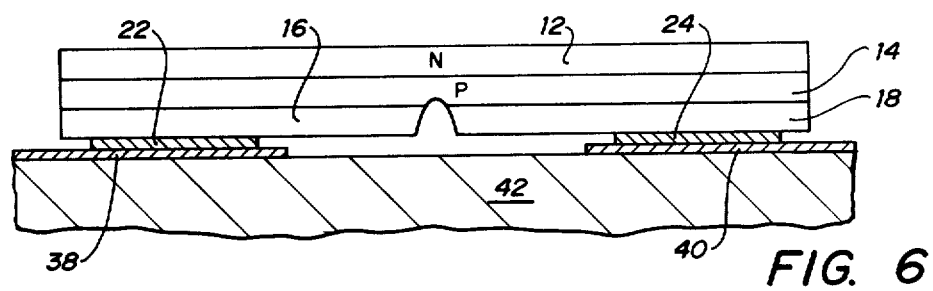
FIG. 6 is an illustration of the attachment of the lateral diac of FIG. 1 to metal leads formed on a ceramic substrate.

FIG. 6 illustrates a side view of a device in accordance with FIG. 1, wherein the electrodes 22 and 24 are connected with metalized leads 38 and 40 which are formed on a ceramic body 42. Metal leads 38 and 40 may be formed in accordance with the packaging technique described and claimed in U.S. patent application Ser. No. 617,443, filed Sept. 29, 1975 and entitled Semiconductor Device Package And Method Of Making Same by applicant.

Figure 7:
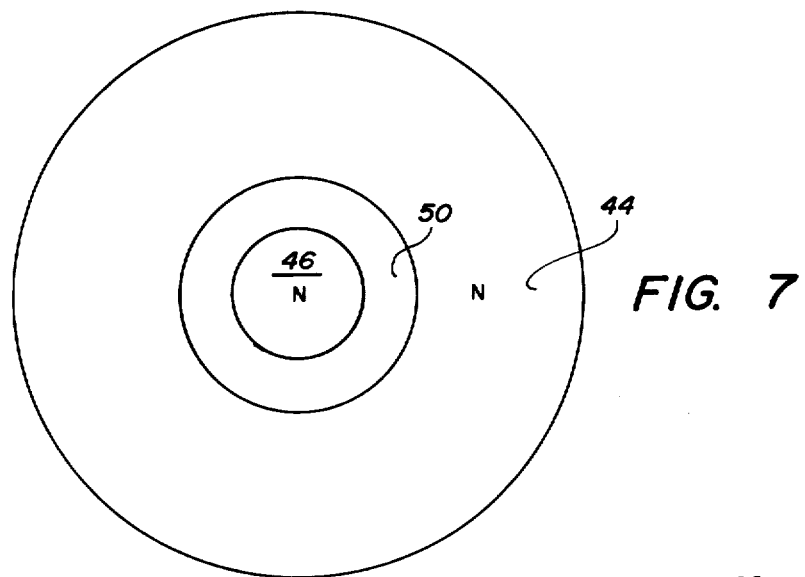
FIG. 7 is a top view of a third embodiment of the lateral diac according to the present invention.

FIG. 7 is a top view of a third embodiment of the present invention utilizing a circular configuration. In this configuration, an N-type region 44 is separated from a N-type region 46 by a groove of P-type extension 50. Electrodes are attached to the N-type regions 44 and 46 and the device is operated in the same manner as that previously described. The device shown in FIG. 7 further includes a N-type layer equivalent to layer 12 on the side not shown.

Figure 8:
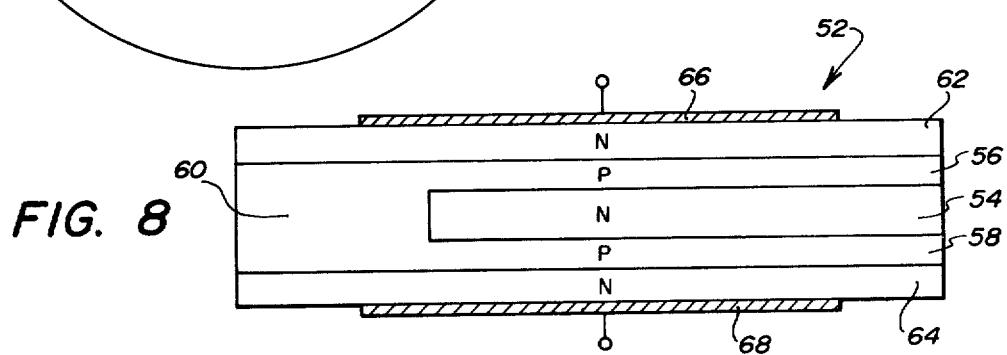
FIG. 8 is a cross-sectional view of an embodiment of a non-lateral diac according to the invention.

FIG. 8 illustrates yet another embodiment of the present invention which operates in a similar manner as that previously described, but which is not a lateral diac. This embodiment comprises a semiconductor body generally identified by the numeral 52 and includes a central N-type layer 54 surrounded on opposite sides by P-type layers 56 and 58. A region 60 of P-type material extends through one side of the N-type layer 54 and integrally communicates with the P-type layers 56 and 58. A N-type layer 62 is formed adjacent the P-type layer 56, while a N-type layer 64 is formed adjacent the P-type layer 58. An electrode 66 contacts layer 62, while an electrode 68 contacts layer 64.

In operation of the diac shown in FIG. 8, the device is essentially nonconductive until breakover voltage is applied across electrodes 66 and 68. At that point, appreciable current begins to flow through the region 60 and appears as gate drive for an N-P-N-P device until the device completely turns on and therefore becomes equivalent to a five layer N-P-N-P-N device to provide the desired high current level operation.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A semiconductor diac comprising:
   a semiconductor body including layers of five alternating opposite semiconductor conductivity types,
   said central interior layer having a first conductivity type and having two adjacent layers of said second conductivity type on opposite sides thereof,
   an appreciable integral single region of said second conductivity type extending through one edge of said central interior layer and integrally connecting said two adjacent layers of said second conductivity type to form a structure including said appreciable integral single region and said two adjacent layers of said second conductivity type having a substantially U-shaped cross-sectional shape to define a gate drive region interior of said semiconductor body adjacent said edge of said central interior layer and within said appreciable integral single region,
   a first electrode contacting an exterior surface of a first exterior layer of said semiconductor body having said first conducting type, and
   a second electrode contacting an exterior surface of a second exterior of said semiconductor body layer having said first conductivity type,
   said first and second electrodes providing a two electrode diac, wherein said two electrode diac is responsive to a predetermined breakover voltage means supplied from a voltage supply source and applied across said electrodes to allow appreciable current flow through said gate drive region to appear as date drive current to cause said two electrode diac to become conductive and to break back to a negative resistance characteristic.

* * * * *